(12) United States Patent
Cheng (10) Patent No.: US 12,339,699 B2
(45) Date of Patent: Jun. 24, 2025

(54) MEMORY, CONTROL APPARATUS, CLOCK PROCESSING METHOD, AND ELECTRONIC DEVICE (71) Applicant: CHANGXIN MEMORY TECHNOLOGIES, INC., Hefei (CN)

(72) Inventor: Jingwei Cheng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 413 days.

(21) Appl. No.: 18/154,208

(22) Filed: Jan. 13, 2023

(65) Prior Publication Data
US 2024/0012444 A1 Jan. 11, 2024

Related U.S. Application Data (63) Continuation of application No. PCT/CN2022/109993, filed on Aug. 3, 2022.

(30) Foreign Application Priority Data

Jul. 8, 2022 (CN) .......................... 202210806176.0

(51) Int. Cl.
G06F 1/08 (2006.01)
G06F 1/10 (2006.01)
(Continued)

(52) U.S. Cl.
CPC ................. *G06F 1/08* (2013.01); *G06F 1/10* (2013.01); *G11C 7/1066* (2013.01); *G11C 7/222* (2013.01);
(Continued)

(58) Field of Classification Search
CPC .. G06N 20/00; G06F 1/08; G06F 1/10; G11C 2207/2254; G11C 29/023; G11C 29/028;
(Continued)

(56) References Cited

U.S. PATENT DOCUMENTS 6,882,238 B2    4/2005 Kurd
9,053,777 B1    6/2015 Crosland
(Continued)

FOREIGN PATENT DOCUMENTS

CN    102737718 A    10/2012
CN    106656123 A    5/2017
(Continued)

OTHER PUBLICATIONS

Korean Intellectual Property Office, Office Action Issued in Application No. 10-2022-7042133, Apr. 22, 2024, 10 pages.
(Continued)

Primary Examiner — Terrell S Johnson
(74) Attorney, Agent, or Firm — Kilpatrick Townsend & Stockton LLP (57) ABSTRACT A memory, a control apparatus, a clock processing method, and an electronic device are provided. A clock processing circuit in the memory includes: a duty cycle module, configured to adjust a duty cycle of a data clock signal to output an internal clock signal; a first clock generation module, configured to receive the internal clock signal, and output a first read clock signal based on the internal clock signal, the first read clock signal being a pulse signal; a second clock generation module, configured to generate and output a second read clock signal during existence of the first read clock signal, the second read clock signal having only one level state change edge; and a selection module, configured to receive the first read clock signal and the second read clock signal, and output the first read clock signal or the second read clock signal as a target read clock signal.

17 Claims, 7 Drawing Sheets (51) Int. Cl.
*G11C 7/10* (2006.01)
*G11C 7/22* (2006.01)
*G11C 29/02* (2006.01)
*G11C 29/50* (2006.01)

(52) U.S. Cl.
CPC .......... *G11C 29/023* (2013.01); *G11C 29/028* (2013.01); *G11C 29/50012* (2013.01); *G11C 2207/2254* (2013.01)

(58) Field of Classification Search
CPC .. G11C 29/50012; G11C 7/1066; G11C 7/222
See application file for complete search history.

(56) References Cited

U.S. PATENT DOCUMENTS

| | | | |
|---|---|---|---|
| 9,437,284 | B1 | 9/2016 | Chen |
| 10,033,365 | B2 | 7/2018 | Elbadry et al. |
| 10,169,262 | B2 | 1/2019 | West et al. |
| 10,303,200 | B2 | 5/2019 | John et al. |
| 10,943,667 | B2 | 3/2021 | Fujiwara et al. |
| 2004/0183613 | A1 | 9/2004 | Kurd |
| 2005/0184764 | A1 | 8/2005 | Kurd et al. |
| 2012/0081164 | A1 | 4/2012 | Ricavy et al. |
| 2012/0250426 | A1* | 10/2012 | Huang ................ G11C 7/1066 365/189.11 |
| 2014/0133248 | A1 | 5/2014 | Huang |
| 2017/0126219 | A1 | 5/2017 | Elbadry et al. |
| 2017/0257087 | A1 | 9/2017 | Elbadry et al. |
| 2018/0005686 | A1 | 1/2018 | Oh |
| 2018/0246557 | A1 | 8/2018 | John et al. |
| 2018/0309431 | A1 | 10/2018 | Elbadry et al. |
| 2019/0237127 | A1 | 8/2019 | Moon |
| 2019/0267979 | A1* | 8/2019 | Elbadry .................. H02M 3/07 |
| 2020/0162066 | A1 | 5/2020 | Gans |
| 2020/0336137 | A1 | 10/2020 | Gans |
| 2020/0381028 | A1 | 12/2020 | Kim |
| 2021/0166749 | A1 | 6/2021 | Moon |
| 2022/0122648 | A1 | 4/2022 | Moon |
| 2022/0149828 | A1* | 5/2022 | Gans ........................ G11C 7/00 |
| 2022/0310151 | A1 | 9/2022 | Moon |
| 2022/0383931 | A1 | 12/2022 | Moon |
| 2023/0274776 | A1 | 8/2023 | Moon |
| 2023/0317138 | A1 | 10/2023 | Moon |

FOREIGN PATENT DOCUMENTS

| | | |
|---|---|---|
| CN | 110226148 A | 9/2019 |
| CN | 107835988 B | 12/2020 |
| KR | 20060080383 A | 7/2006 |
| TW | 200713322 A | 4/2007 |
| TW | 201230059 A | 7/2012 |
| TW | 202034340 A | 9/2020 |

OTHER PUBLICATIONS

First Office Action of the Taiwanese application No. 112103885, issued on Oct. 19, 2023. 7 pages with English abstract.
Supplementary European Search Report in the European application No. 22838627.2, mailed on Dec. 15, 2023. 9 pages.

* cited by examiner

MEMORY, CONTROL APPARATUS, CLOCK PROCESSING METHOD, AND ELECTRONIC DEVICE

CROSS-REFERENCE TO RELATED APPLICATIONS

This application is a continuation of International Patent Application No. PCT/CN2022/109993, filed on Aug. 3, 2022, which is based upon and claims priority to Chinese Patent Application No. 202210806176.0, filed on Jul. 8, 2022. The entire contents of International Patent Application No. PCT/CN2022/109993 and Chinese Patent Application No. 202210806176.0 are hereby incorporated herein by reference in their entireties.

BACKGROUND

In an electronic device, a Central Processing Unit (CPU) sends a read instruction to a memory, then receives a read clock signal and a read data signal that are returned by the memory, and performs latch processing on the read data signal using the read clock signal, so as to obtain required data. However, in a process of adjusting a duty cycle of a clock signal by the memory, the CPU needs to obtain a duty cycle parameter of the clock signal by reading a corresponding mode register in the memory. However, in this process, the clock signal in the memory may be distorted, and the read clock signal returned by the memory to a central controller is also distorted, which causes the CPU to obtain wrong data, and eventually causes failure in adjustment of the duty cycle of the clock signal.

SUMMARY

The present disclosure relates to the field of semiconductor memory technologies, and provides a memory, a control apparatus, a clock processing method, and an electronic device.

In a first aspect, the embodiments of the present disclosure provide a memory. The memory includes a clock processing circuit. The clock processing circuit includes: a duty cycle circuit, a first clock generation circuit, a second clock generation circuit, and a selector.

The duty cycle circuit is configured to receive a data clock signal externally generated; and adjust a duty cycle of the data clock signal to output an internal clock signal.

The first clock generation circuit is configured to receive the internal clock signal, and output a first read clock signal based on the internal clock signal. Herein, the first read clock signal is a pulse signal.

The second clock generation circuit is configured to generate and output a second read clock signal during existence of the first read clock signal. Herein, the second read clock signal has only one level state change edge.

The selector is configured to receive the first read clock signal and the second read clock signal, and output one of the first read clock signal and the second read clock signal as a target read clock signal.

In a second aspect, the embodiments of the present disclosure provide a control apparatus. The control apparatus is a CPU and is connected to a memory.

The control apparatus is configured to send a data read instruction to the memory; and receive a read data signal and a target read clock signal that are returned by the memory, and perform latch processing on the read data signal using the target read clock signal.

Herein, the target read clock signal is a first read clock signal or a second read clock signal, the first read clock signal is a pulse signal, and the second read clock signal has only one level state change edge.

In a third aspect, the embodiments of the present disclosure provide a clock processing method, which is applied to a memory, and the method includes the following operations.

A data clock signal externally generated is received; and a duty cycle of the data clock signal is adjusted to determine an internal clock signal.

A first read clock signal is determined based on the internal clock signal. Herein, the first read clock signal is a pulse signal.

A second read clock signal is generated during existence of the first read clock signal. Herein, the second read clock signal has only one level state change edge.

One of the first read clock signal and the second read clock signal is output as a target read clock signal.

In a fourth aspect, the embodiments of the present disclosure provide an electronic device. The electronic device includes at least the memory in the first aspect and the control apparatus in the second aspect.

DETAILED DESCRIPTION

The technical solutions in the embodiments of the present disclosure will be clearly and completely described with reference to the drawings in the embodiments of the present disclosure. It should be understood that that the specific embodiments described herein are only used to illustrate the relevant disclosure, but are not intended to limit the disclosure. In addition, it is to be noted that for the convenience of description, only the parts related to the relevant disclosure are shown in the drawings.

Unless otherwise defined, all technical and scientific terms used herein have the same meaning as commonly understood by those skilled in the art to which the present disclosure belongs. The terms used herein are only for the purpose of describing the embodiments of the present disclosure and are not intended to limit the present disclosure.

In the following description, reference is made to "some embodiments" which describe a subset of all possible embodiments, but it should be understood that "some embodiments" may be the same or different subsets of all possible embodiments, and may be combined with each other without conflict.

It is to be noted that the terms "first/second/third" involved in the embodiments of the present disclosure are only used to distinguish similar objects, and do not represent a specific order of the objects. It should be understood that the specific order or sequence of "first/second/third" may be interchangeable under the allowable circumstances, so that the embodiments of the disclosure described herein may be implemented in an order other than those illustrated or described herein.

Figure 1:
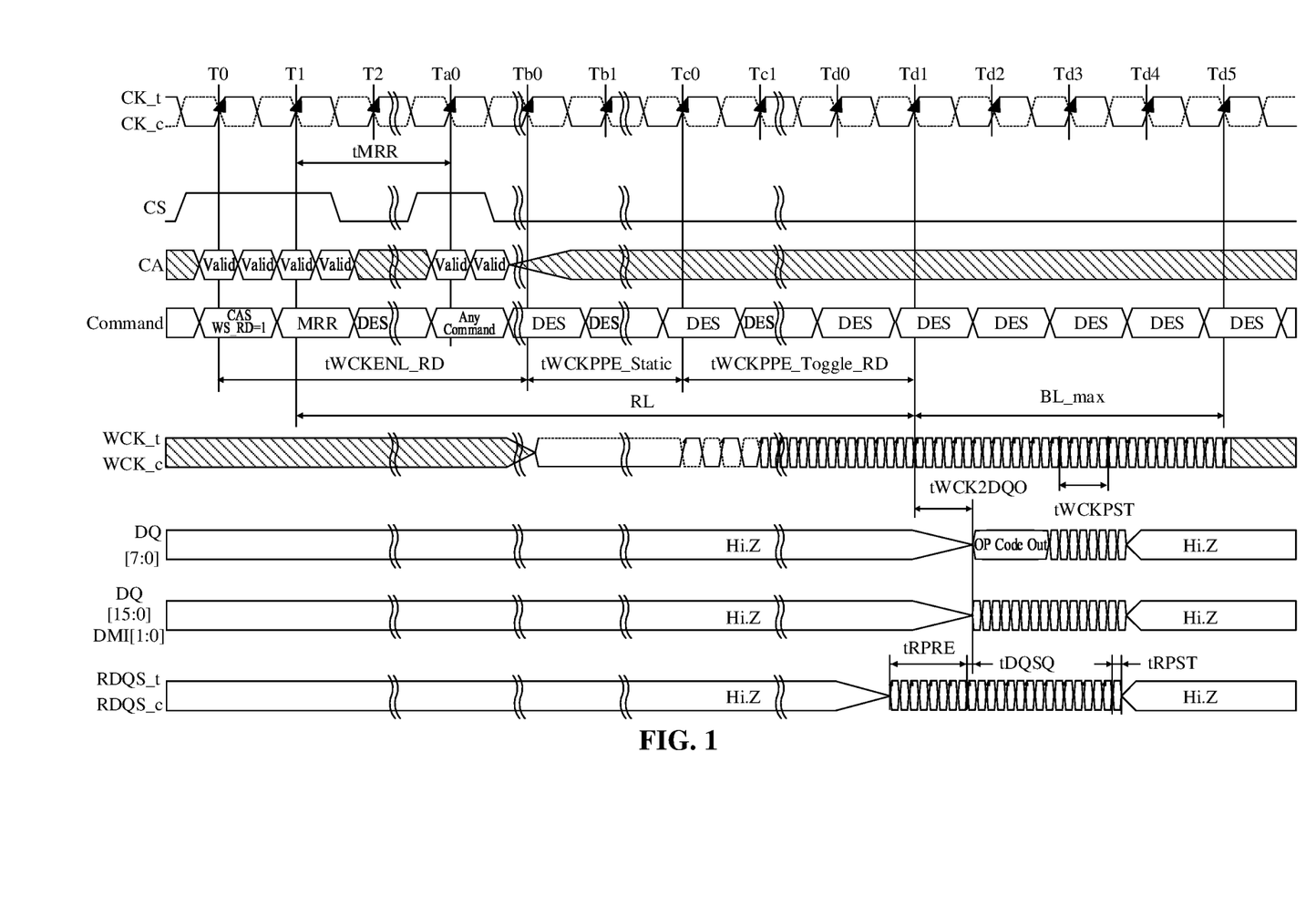
FIG. 1 is a schematic diagram of an operation timing of a Mode Register Read (MRR) instruction.

DRAM: Dynamic Random Access Memory
SDRAM: Synchronous Dynamic Random Access Memory
MRR: Mode Register Read
Mbps: Million bits per second
NMOS (N-Metal-Oxide-Semiconductor): N-channel field effect transistor
PMOS (P-Metal-Oxide-Semiconductor): P-channel field effect transistor In a memory (such as a DRAM), an MRR instruction and a normal read instruction use exactly the same operation timing. Referring to FIG. 1, FIG. 1 shows a schematic diagram of an operation timing of an MRR instruction. In FIG. 1, T0, Ti, and the like are configured to identify different clock cycles; CK_c and CK_t are a pair of differential clock signals; CS is a chip select signal; CA is a command address signal; Command indicates an operating instruction; DQ[7:0] is a data signal of a 8-bit memory; DQ[15:0] is a data signal of a 16-bit memory; a data clock signal WCK is an external write clock signal sent by a Host of an electronic device to the memory, which may be represented as a single signal or a pair of differential clock signals WCK_c and WCK_t at different circuit positions; and a read clock signal RDQS is a clock signal output by the memory to the electronic device, which may be represented as a single signal or a pair of differential clock signals RDQS_c and RDQS_t at different circuit positions. Specifically, the memory, after receiving an MRR instruction sent by a CPU, generates a data signal DQ (also referred to as a read data signal), and generates a read clock signal RDQS using an externally received data clock signal WCK. During the execution of a data read instruction, the memory returns the read data signal DQ and the read clock signal RDQS to the CPU together, and then the CPU latches the read data signal DQ using the read clock signal RDQS, thereby obtaining the required data. In addition, FIG. 1 is a standard timing specified by the Joint Electron Device Engineering Council (JEDEC) standard, in which the meaning of each signal, the principle of related changes, and some unmentioned abbreviated terms will be understood with reference to the industry standard document of the JEDEC, and are irrelevant to the technical solutions of the embodiments of the present disclosure and will not affect the understanding of the embodiments of the present disclosure by the technical personnel. Therefore, no explanation is given.

Figure 2:
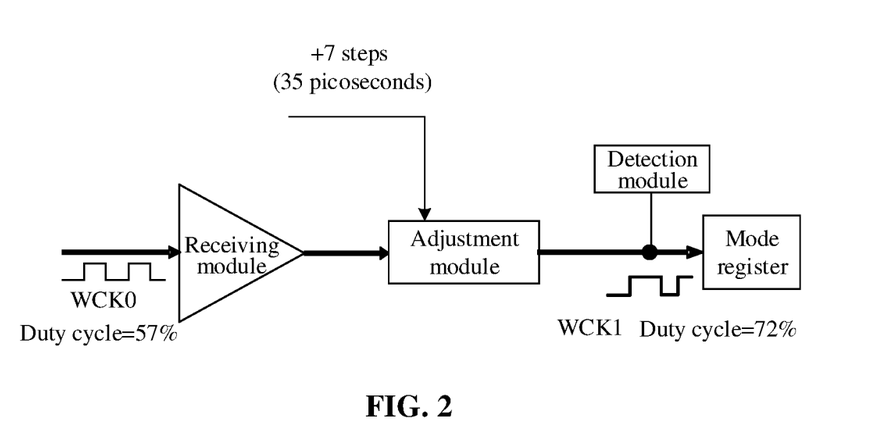
FIG. 2 is a schematic structural diagram of a clock processing circuit.
Figure 3:
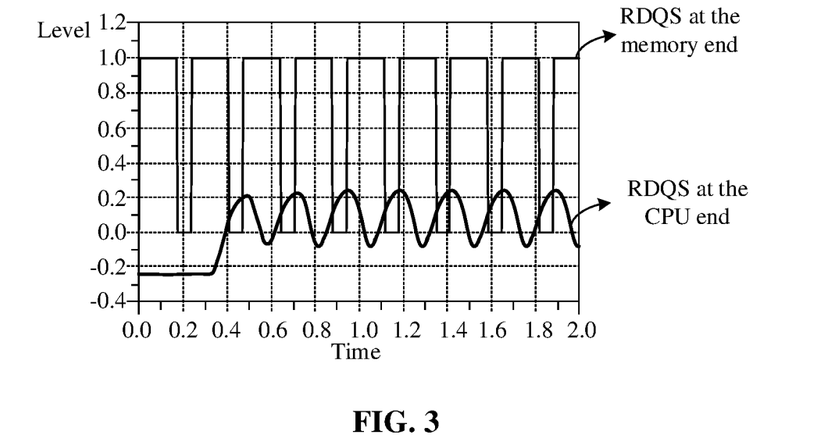
FIG. 3 is a schematic diagram of a waveform of a read clock signal.

A clock processing circuit is arranged in the memory and configured to adjust a duty cycle of a data clock signal WCK0 (including a pair of complementary signals WCK_c/WCK_t), so that the duty cycle of the data clock signal WCK0 meets the requirements. Referring to FIG. 2, FIG. 2 shows a schematic structural diagram of a clock processing circuit. As shown in FIG. 2, in the clock processing circuit, a receiving module is configured to externally receive the data clock signal WCK0, an adjustment module is configured to adjust the duty cycle of the data clock signal WCK0 to obtain an internal clock signal WCK1, and a detection module is configured to detect a duty cycle parameter of the internal clock signal WCK1 and store the duty cycle parameter into a mode register. At the same time, in the process of adjusting the duty cycle by the memory, the CPU sends an MRR instruction to read the duty cycle parameter in the mode register, thereby determining the next operation. In an example, as shown in FIG. 2, assuming that the duty cycle of the externally input data clock signal WCK0 is the upper limit, i.e., 57%, specified by JEDEC, in the initial step of adjusting the duty cycle, the duty cycle adjustment module increases the duty cycle of the data clock signal WCK0 by 7 steps (the upper limit specified by JEDEC, and each step is 5 picoseconds), that is, 35 picoseconds are increased, which is equivalent to increasing the duty cycle by 15% at a speed of 8533 Mbps. In this case, a duty cycle of the internal clock signal WCK1 in the memory will be as high as 72%, and a duty cycle of a read clock signal RDQS generated using the internal clock signal will also be as high as 72%. In this case, referring to FIG. 3, FIG. 3 shows a schematic diagram of a waveform of a read clock signal. As shown in FIG. 3, the read clock signal RDQS with the duty cycle of up to 72% is attenuated by a channel during transmission, and will be seriously distorted when reaching the CPU at the receiving end, which makes it difficult to be correctly identified by the CPU, that is, wrong data may be obtained through the MRR instruction, thereby eventually causing failure in adjustment of the duty cycle. If the speed of the memory is higher, this problem may be more serious.

Base on this, the embodiments of the present disclosure provide a memory. The memory includes a clock processing circuit. The clock processing circuit includes: a duty cycle module, configured to receive a data clock signal externally generated; and adjust a duty cycle of the data clock signal to output an internal clock signal; a first clock generation module, configured to receive the internal clock signal, and output a first read clock signal based on the internal clock signal, the first read clock signal being a pulse signal; a second clock generation module, configured to generate and output a second read clock signal during existence of the first read clock signal, the second read clock signal having only one level state change edge; and a selection module, configured to receive the first read clock signal and the second read clock signal, and output one of the first read clock signal and the second read clock signal as a target read clock signal. In this way, in a case of duty cycle distortion of the internal clock signal of the memory, the second read clock signal with a single level change edge will be selected as the target read clock signal to avoid failure in data latching.

The embodiments of the present disclosure will be described in detail below with reference to the accompanying drawings.

Figure 4:
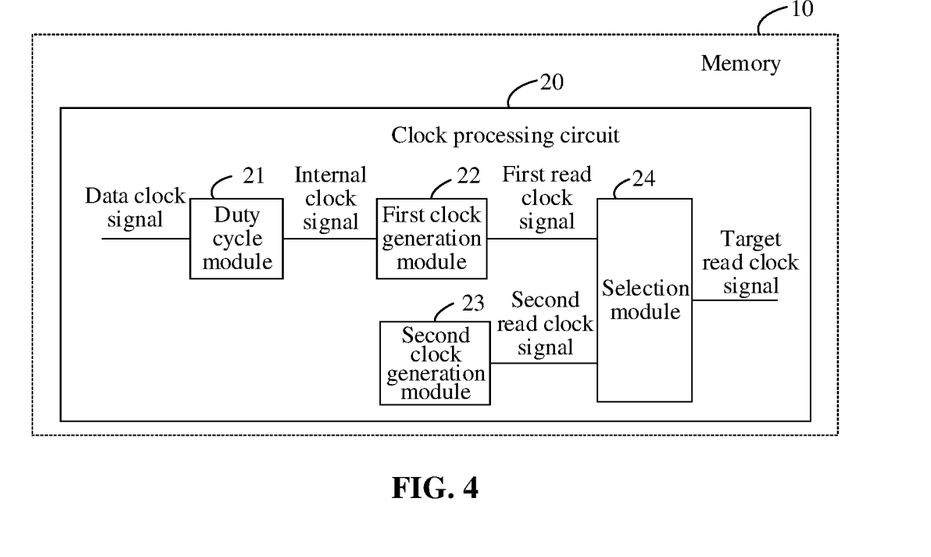
FIG. 4 is a schematic structural diagram of a memory according to an embodiment of the present disclosure.

In an embodiment of the present disclosure, referring to FIG. 4, FIG. 4 shows a schematic structural diagram of a memory 10 according to an embodiment of the present disclosure. As shown in FIG. 4, the memory 10 includes a clock processing circuit 20. The clock processing circuit 20 includes: a duty cycle module 21, a first clock generation module 22, a second clock generation module 23, and a selection module 24.

The duty cycle module 21 is configured to receive a data clock signal externally generated; and adjust a duty cycle of the data clock signal to output an internal clock signal.

The first clock generation module 22 is configured to receive the internal clock signal, and output a first read clock signal based on the internal clock signal. Herein, the first read clock signal is a pulse signal.

The second clock generation module 23 is configured to generate and output a second read clock signal during existence of the first read clock signal. Herein, the second read clock signal has only one level state change edge.

The selection module 24 is configured to receive the first read clock signal and the second read clock signal, and output one of the first read clock signal and the second read clock signal as a target read clock signal.

It is to be noted that the memory 10 in the embodiment of the present disclosure may include various types of semiconductor memories, such as a DRAM, a SDRAM, a double data rate DRAM, a low power double data rate DRAM, and the like.

The memory 10 is provided with the first clock generation module 22 and the second clock generation module 23. The first clock generation module 22 may generate the first read clock signal with a plurality of pulses based on the data clock signal externally received. The second clock generation module 23 may generate the second read clock signal with only one level state change edge. In this way, in different working scenarios, the first read clock signal or the second read clock signal may be selected as the target read clock signal for sending to the CPU, so as to realize data latch processing. In particular, since the second read clock signal is not affected by the duty cycle distortion of the internal clock signal, the correct latching of data will still be ensured in a scenario where the duty cycle distortion of the internal clock signal is large.

Here, the specific waveform and generation process of the second read clock signal have various possibilities, and the embodiments of the present disclosure are only used as examples subsequently and do not constitute a specific limitation. In particular, the level change edge of the second read clock signal is synchronized with an end time of valid data in a read data signal, or the level change edge of the second read clock signal is ahead of an end time of valid data in a read data signal, thereby ensuring correct latching of the valid data. In addition, the level change edge may be a rising edge (that is, the second read clock signal changes from a low level to a high level) or a falling edge (that is, the second read clock signal changes from a high level to a low level).

Figure 5:
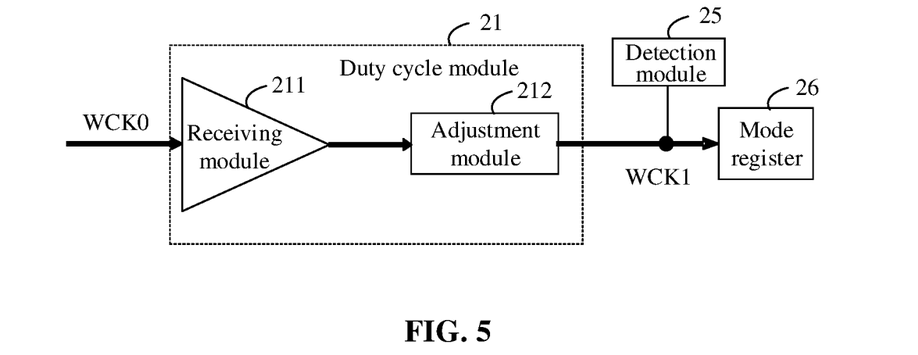
FIG. 5 is a first schematic partial structural diagram of a clock processing circuit according to an embodiment of the present disclosure.

It is to be noted that as shown in FIG. 5, the duty cycle module 21 includes two parts: a receiving module 211 and an adjustment module 212. For the specific implementation of the receiving module 211 and the adjustment module 212, reference may be made to the subsequent description. The first clock generation module 22 may include a logic device and a delay cell, to achieve delay matching and conform to the standard timing specified by the JEDEC standard. The second clock generation module 23 may include a frequency divider which contains a D-type flip-flop and an inverter. The selection module 24 may be implemented by a one-of-two data selector.

In some embodiments, the data clock signal is an externally received write clock signal, which is subsequently represented as WCK0. The internal clock signal is a write clock signal subjected to duty cycle adjustment in the memory, which is subsequently represented as WCK1. The target read clock signal is a read operation data strobe signal, which is subsequently represented as RDQS. The read data signal may be represented as DQ.

In some embodiments, as shown in FIG. 5, the clock processing circuit 20 further includes a detection module 25 and a mode register 26. Herein, the detection module 25 is configured to receive the internal clock signal WCK1, detect a duty cycle of the internal clock signal WCK1 to output a duty cycle parameter. The mode register 26 is configured to receive and store the duty cycle parameter.

It is to be noted that the detection module 25 may include a logic gate, a transmission gate, a capacitor and a signal comparator.

Figure 6:
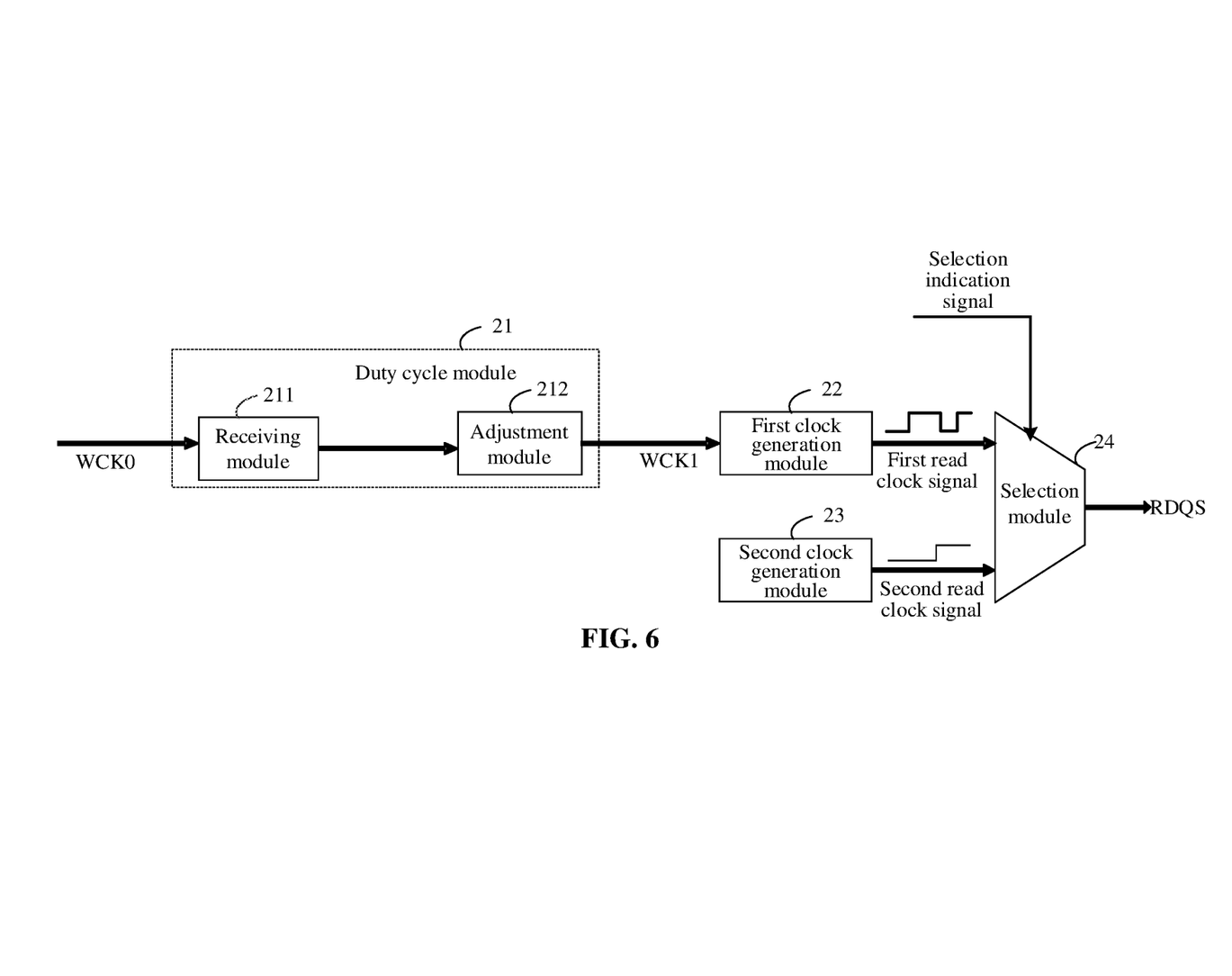
FIG. 6 is a second schematic partial structural diagram of a clock processing circuit according to an embodiment of the present disclosure.

In some embodiments, as shown in FIG. 6, the selection module 24 is configured to receive a selection indication signal, and output the first read clock signal as the target read clock signal RDQS in response to the selection indication signal being in a first state; or, output the second read clock signal as the target read clock signal RDQS in response to the selection indication signal being in a second state.

Here, the selection module 24 may be a one-of-two data selector, so as to output the first read clock signal or the second read clock signal based on the state of the selection indication signal.

In some embodiments, the memory 10 is configured to receive a data read instruction; and output a read data signal DQ based on the data read instruction, and output the target read clock signal RDQS through the clock processing circuit 20. Herein, the target read clock signal RDQS is used to latch the read data signal DQ, and the level state change edge of the second read clock signal indicates an end time of valid data in the read data signal DQ.

That is, in an electronic device including the memory 10, the CPU of the electronic device issues an operating instruction to the memory 10 so as to realize data writing or data reading. In the process of data reading, the CPU sends the data read instruction to the memory 10, and the memory 10 generates the read data signal DQ (carrying parameters that the CPU needs to read) based on the data read instruction, and generates the target read clock signal RDQS through the clock processing circuit 20. In this way, both the read data signal DQ and the target read clock signal RDQS are sent to the CPU, so that the CPU latches the read data signal using the target read clock signal RDQS, and obtains the required parameters by subsequent decoding.

In the embodiment of the present disclosure, the data read instruction is classified into two types, that is, a first read instruction and a second read instruction. The second read instruction instructs to obtain the duty cycle parameter in the mode register 26 in the clock processing circuit 20, and the first read instruction is a data read instruction other than the second read instruction.

In a specific embodiment, the memory 10 is further configured to set the selection indication signal to be in the first state in response to the data read instruction being the first read instruction; or, set the selection indication signal to be in the second state in response to the data read instruction being the second read instruction.

As mentioned above, in a case that the data read instruction is configured to read the duty cycle parameter in the mode register 26, the memory 10 may be in the process of adjusting the duty cycle, and in some cases, the internal clock signal WCK1 has been distorted, for example, the duty cycle of the internal clock signal WCK1 may be as high as 72%, and in this case, the first read clock signal may also be distorted, and the CPU may obtain an incorrect result by latching the read data signal DQ using the first read clock signal. For the embodiment of the present disclosure, in a case that the data read instruction is configured to read the duty cycle parameter in the mode register 26, the second read clock signal is output as the target read clock signal RDQS. Since the second read clock signal has only one level change edge and will not be affected by the duty cycle distortion of the internal clock signal WCK1, the CPU may latch the data signal using the level change edge in the second read clock signal, so as to obtain the correct duty cycle parameter.

In addition, in order to save power consumption, in a case that the data read instruction is the first read instruction, the second clock generation module 23 may be disabled, that is, the second clock generation module 23 does not work, thereby achieving the purpose of reducing current and power consumption.

In another specific embodiment, the memory 10 is further configured to set the selection indication signal to be in the first state in response to the data read instruction being the first read instruction; or, set the selection indication signal to be in the first state in response to the data read instruction being the second read instruction and the duty cycle of the internal clock signal WCK1 being within a preset range; or, set the selection indication signal to be in the second state in response to the data read instruction being the second read instruction and the duty cycle of the internal clock signal WCK1 being not within a preset range.

That is, in a case that the data read instruction is configured to read the duty cycle parameter in the mode register 26, if the duty cycle of the internal clock signal WCK1 meets the requirements, in this case, the first read clock signal will not be distorted, the CPU may still latch the read data signal using the first read clock signal.

The specific waveform of the second read clock signal and the latching process of the read data signal are described below by taking the DRAM having a burst length of 16 and having 16 DQ terminals as an example.

For the second read instruction, the first 8 bits of the read data signal DQ carry valid data, represented as DQ<7:0>. According to the provisions of the JEDEC standard, the parameter value (MR Content) of the mode register is transmitted in the first 8 beats (the first 4 clock cycles) of the target read clock signal RDQS, and the uncared—for data (Valid) is transmitted in the last 8 beats (the last 4 clock cycles) of the target read clock signal RDQS. At this time, the first read clock signal includes 8 clock cycles, and the level state change edge of the second read clock signal is aligned with a rising edge of the fifth clock cycle in the first read clock signal. Herein, the level state change edge of the second read clock signal is a change of the second read clock signal from a low level state to a high level state.

Figure 7A:
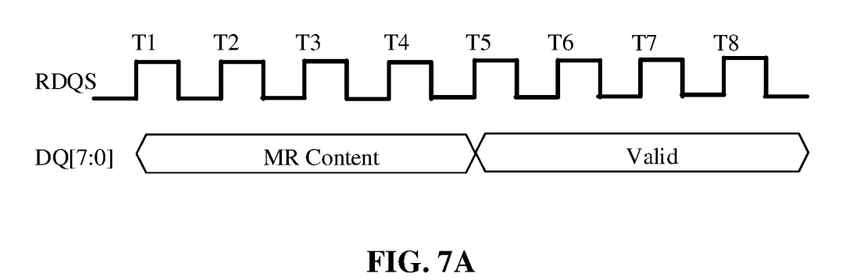
FIGS. 7A and 7B are schematic diagrams of a signal waveform of data latch processing according to an embodiment of the present disclosure.
Figure 7B:
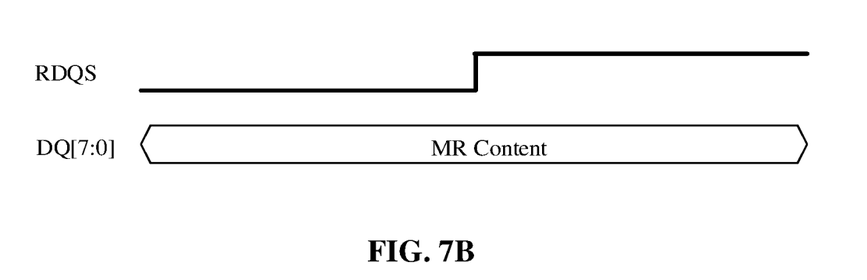

That is to say, as shown in FIG. 7A, if the first read clock signal is used as the target read clock signal RDQS, the CPU may latch the read data signal DQ<7:0> using the signal edges of the target read clock signal RDQS, the data latched in the first 4 clock cycles is MR Content, and the data Valid latched in the last 4 clock cycles is not used. As shown in FIG. 7B, if the second read clock signal is used as the target read clock signal RDQS, the CPU may latch the read data signal DQ<7:0> using the rising edge in the second read clock signal to obtain the MR Content.

In some embodiments, as shown in FIG. 5 or FIG. 6, the duty cycle module 21 includes: a receiving module 211, configured to externally receive and output the data clock signal WCK0; and an adjustment module 212, configured to adjust the duty cycle of the data clock signal WCK0 to output the internal clock signal WCK1.

It is to be noted that the adjustment module 212 is configured for duty cycle adjustment. When the duty cycle adjustment starts, the default setting of the adjustment module 212 may cause the duty cycle of the data clock signal WCK0 to increase by a certain value. According to the provisions of the JEDEC, the upper limit of the increase in the duty cycle is 7 steps, that is, 35 picoseconds.

The receiving module 211 may be implemented by a signal receiver which includes devices such as a NMOS and a PMOS, the adjustment module 212 may include cascaded delay cells, and each delay cell includes a NMOS and a PMOS, so as to realize the forward/backward adjustment of the rising edge in the data clock signal WCK0, and/or, the forward/backward adjustment of the falling edge in the data clock signal WCK0, thereby adjusting the duty cycle of the data clock signal WCK0 finally.

Figure 8A:
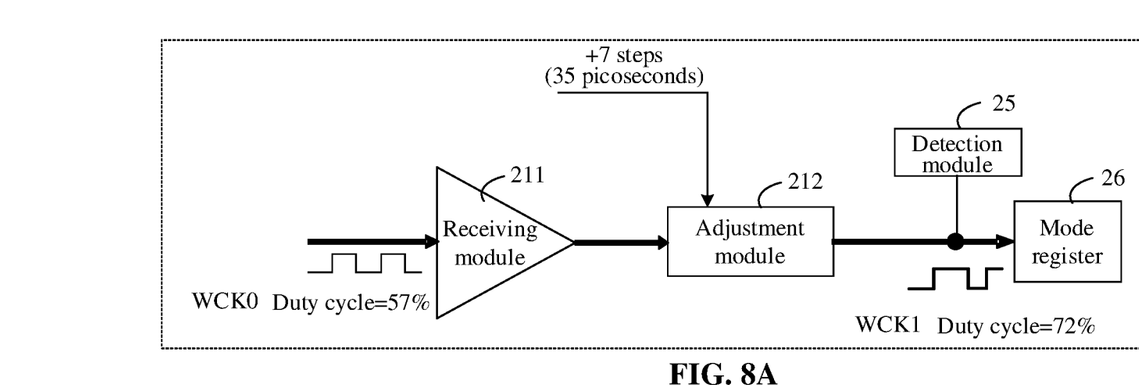
FIGS. 8A and 8B are schematic diagrams of a working process of a clock processing circuit according to an embodiment of the present disclosure.
Figure 8B:
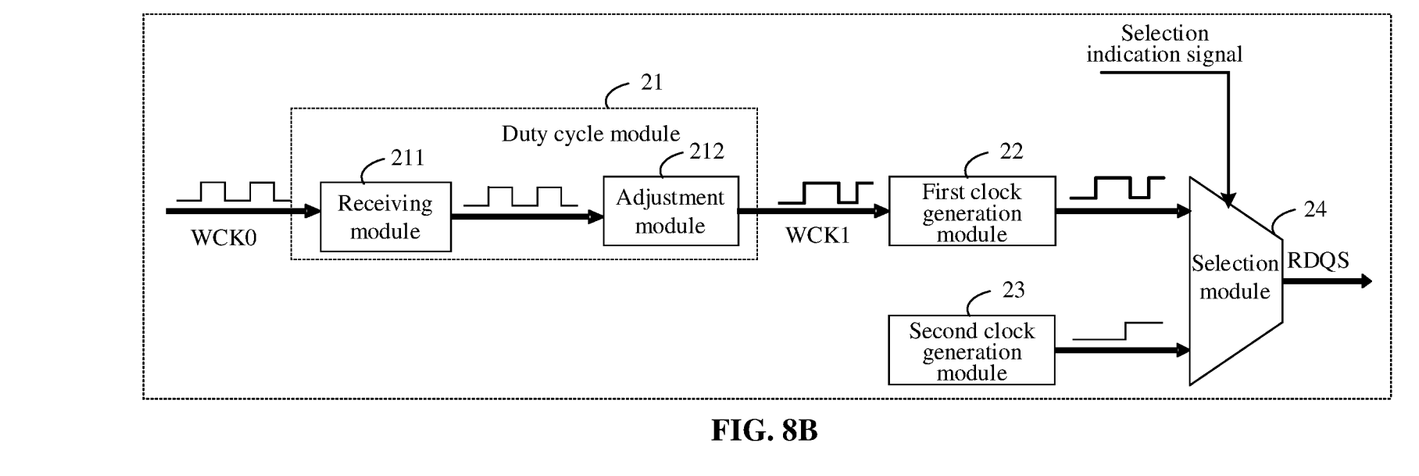

A possible working scenario is provided below to illustrate the technical effects of the embodiments of the present disclosure. As shown in FIG. 8A, the duty cycle of the externally generated data clock signal WCK0 is 57%, when the process of the duty cycle adjustment starts, the duty cycle of the data clock signal WCK0 is increased by 7 steps (35 picoseconds) by default, if the speed of the memory is 8633 Mbps, the duty cycle of the internal clock signal WCK1 may be obtained by continuing to increase by 15% on the basis of the data clock signal WCK0, that is, the duty cycle of the internal clock signal WCK1 will be as high as 72%. As shown in FIG. 8B, at this time, the CPU sends the second read instruction to the memory, the selection indication signal will be set to be in the second state, and the memory 10 takes the second read clock signal with the single signal edge as the target read clock signal RDQS, so that the CPU may latch the read data signal DQ<7:0> using the second read clock signal to obtain the correct duty cycle parameter, thereby ensuring the success of the duty cycle adjustment operation.

To sum up, the embodiments of the present disclosure provide a memory. The memory includes a clock processing circuit. The clock processing circuit includes: a duty cycle module, configured to receive a data clock signal externally generated; and adjust a duty cycle of the data clock signal to output an internal clock signal; a first clock generation module, configured to receive the internal clock signal, and output a first read clock signal based on the internal clock signal, the first read clock signal being a pulse signal; a second clock generation module, configured to generate and output a second read clock signal during existence of the first read clock signal, the second read clock signal having only one level state change edge; and a selection module, configured to receive the first read clock signal and the second read clock signal, and output one of the first read clock signal and the second read clock signal as a target read clock signal. In this way, in a case of the duty cycle distortion of the internal clock signal, the second read clock signal with the single level change edge will be selected as the target read clock signal to avoid failure in data latching.

Figure 9:
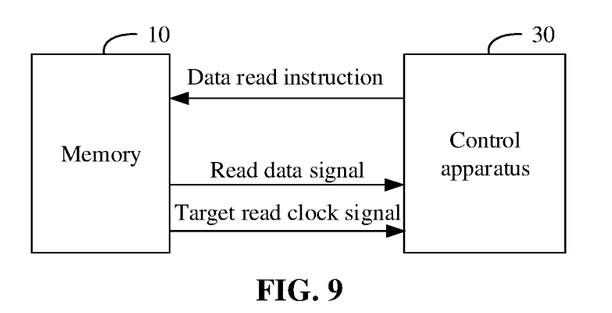
FIG. 9 is a schematic structural diagram of a control apparatus according to an embodiment of the present disclosure.

In another embodiment of the present disclosure, referring to FIG. 9, FIG. 9 shows a schematic structural diagram of a control apparatus 30 according to an embodiment of the present disclosure. As shown in FIG. 9, the control apparatus 30 is connected to a memory 10.

The control apparatus 30 is configured to send a data read instruction to the memory 10; and receive a read data signal DQ and a target read clock signal RDQS that are returned by the memory 10, and perform latch processing on the read data signal DQ using the target read clock signal RDQS. Herein, the target read clock signal RDQS is a first read clock signal or a second read clock signal, the first read clock signal is a pulse signal, and the second read clock signal has only one level state change edge.

It is to be noted that the control apparatus 30 may be a CPU. Specifically, the control apparatus 30 sends an instruction through a memory controller of the memory 10 to read the data of the mode register/memory array in the memory 10. Specifically, when reading the data of the memory 10, the CPU sends the data read instruction to the memory through a command bus and a data bus, and the memory 10 parses the data read instruction and performs the corresponding read operation to obtain the read data signal. In addition, the memory also generates the target read clock signal, so that the control apparatus 30 performs latch processing on the read data signal DQ using the target read clock signal RDQS to obtain the required data.

With reference to FIGS. 4 to 6, in the embodiment of the present disclosure, the target read clock signal RDQS received by the control apparatus 30 from the memory 10 may have a plurality of pulses or may have only one level state change edge. That is to say, when the duty cycle of the first read clock signal is distorted, the memory 10 sends the second read clock signal with only one level state change edge as the target read clock signal RDQS to the control apparatus 30, so as to correctly latch the read data signal DQ.

In a specific embodiment, the control apparatus 30 is configured to receive the first read clock signal returned by the memory 10 in response to the data read instruction being a first read instruction, and perform latch processing on the read data signal DQ using the first read clock signal; or, receive the second read clock signal returned by the memory 10 in response to the data read instruction being a second read instruction, and perform latch processing on the read data signal DQ using the level state change edge of the second read clock signal.

It is to be noted that the memory 10 includes a clock processing circuit 20. The second read instruction instructs to obtain a duty cycle parameter in a mode register in the clock processing circuit 20, and the first read instruction is a data read instruction other than the second read instruction.

In this way, in a case that the data read instruction is the second read instruction, the memory 10 may be in the process of the duty cycle adjusting, and the internal clock signal WCK1 in the memory 10 may be distorted, that is, the first read clock signal is distorted, so the second read clock signal may be used as the target read clock signal RDQS, so that the control apparatus 30 may obtain the correct duty cycle parameter. On the contrary, in a case that the data read instruction is the first read instruction, both the internal clock signal WCK1 and the first read clock signal in the memory are normal, and therefore, the first read clock signal may be used as the target read clock signal RDQS, and the control apparatus 30 may obtain the correct result.

In another specific embodiment, the control apparatus 30 is further configured to receive the first read clock signal returned by the memory 10 in response to the data read instruction being the second read instruction, and perform latch processing on the read data signal DQ using level state change edges of the first read clock signal.

In this way, in a case that the data read instruction is the second read instruction, the internal clock signal WCK1 and the first read clock signal in the memory 10 may still be normal, so that the memory 10 may still use the first read clock signal as the target read clock signal RDQS.

The embodiments of the present disclosure provide a control apparatus. The control apparatus is connected to a memory. The control apparatus is configured to send a data read instruction to the memory; and receive a read data signal and a target read clock signal returned by the memory, and perform latch processing on the read data signal using the target read clock signal. Herein, the target read clock signal is a first read clock signal or a second read clock signal, the first read clock signal is a pulse signal, and the second read clock signal has only one level state change edge. In this way, in a case of the duty cycle distortion of the internal clock signal, the read data signal may be latched using the second read clock signal with the single level change edge to avoid failure in data latching.

Figure 10:
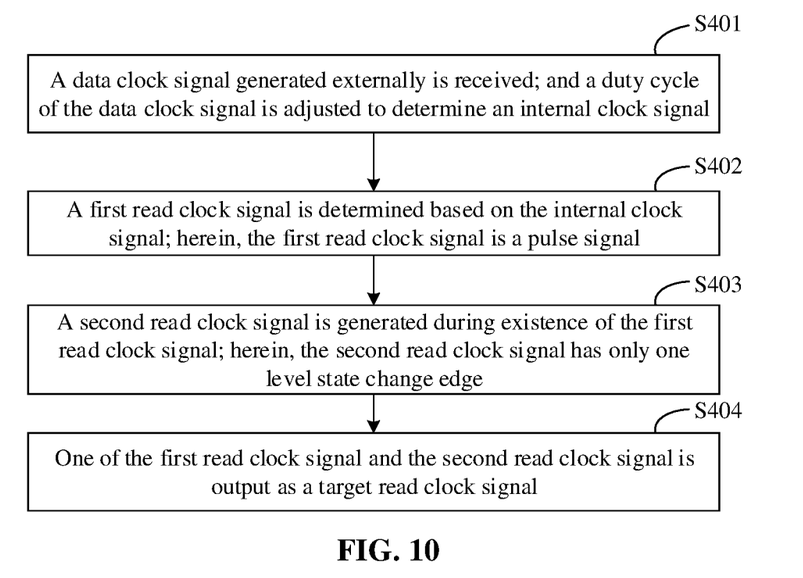
FIG. 10 is a flowchart of a clock processing method according to an embodiment of the present disclosure.

In yet another embodiment of the present disclosure, referring to FIG. 10, FIG. shows a flowchart of a clock processing method according to an embodiment of the present disclosure. As shown in FIG. 10, the method includes the following operations.

At S401, a data clock signal externally generated is received; and a duty cycle of the data clock signal is adjusted to determine an internal clock signal.

At S402, a first read clock signal is determined based on the internal clock signal. Herein, the first read clock signal is a pulse signal.

At S403, a second read clock signal is generated during existence of the first read clock signal. Herein, the second read clock signal has only one level state change edge.

At S404, one of the first read clock signal and the second read clock signal is output as a target read clock signal.

It is to be noted that the method is applied to the aforementioned memory 10. In this way, the memory 10 may generate the first read clock signal and the second read clock signal at the same time, and in different working scenarios, the first read clock signal or the second read clock signal may be selected as the target read clock signal RDQS for sending to a CPU, so as to realize data latch processing. In particular, since the second read clock signal is not affected by the duty cycle distortion of the internal clock signal WCK1, correct latching of the data signal may still be ensured in a scenario where the duty cycle distortion of the internal clock signal WCK1 is large.

In some embodiments, as mentioned above, the memory 10 includes a mode register 26, and the method further includes the following operations.

A duty cycle of the internal clock signal is detected to obtain a duty cycle parameter; and the duty cycle parameter is stored into the mode register.

In a specific embodiment, as mentioned above, the memory 10 is connected to a control apparatus 30. The operation that one of the first read clock signal and the second read clock signal is output as the target read clock signal includes the following operations.

In response to receiving a first read instruction sent by the control apparatus, a read data signal is determined based on the first read instruction, and the first read clock signal is determined as the target read clock signal; or, in response to receiving a second read instruction sent by the control apparatus, a read data signal is determined based on the second read instruction, and the second read clock signal is determined as the target read clock signal.

Here, the target read clock signal is used to latch the read data signal, the second read instruction instructs to obtain the duty cycle parameter in the mode register, and the first read instruction is a data read instruction other than the second read instruction.

In another specific embodiment, the operation that one of the first read clock signal and the second read clock signal is output as the target read clock signal includes the following operations.

In response to receiving a first read instruction sent by the control apparatus, a read data signal is determined based on the first read instruction, and the first read clock signal is determined as the target read clock signal; or, in response to receiving a second read instruction sent by the control apparatus and the duty cycle parameter being within a preset range, a read data signal is determined based on the second read instruction, and the first read clock signal is determined as the target read clock signal; or, in response to receiving a second read instruction sent by the control apparatus and the duty cycle parameter being not within a preset range, a read data signal is determined based on the second read instruction, and the second read clock signal is determined as the target read clock signal.

The embodiments of the present disclosure provide a clock processing method, which includes that: a data clock signal externally generated is received; and a duty cycle of the data clock signal is adjusted to determine an internal clock signal; a first read clock signal is determined based on the internal clock signal, the first read clock signal being a pulse signal; a second read clock signal is generated during existence of the first read clock signal, the second read clock signal having only one level state change edge; and one of the first read clock signal and the second read clock signal is output as a target read clock signal. In this way, in a case of the duty cycle distortion of the internal clock signal, the second read clock signal with the single level change edge may be selected as the target read clock signal to avoid failure in data latching.

Figure 11:
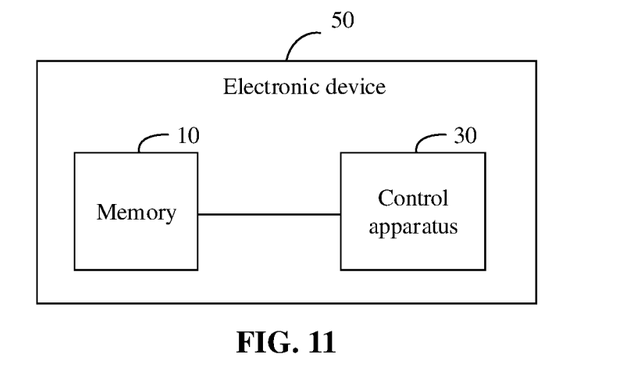
FIG. 11 is a schematic structural diagram of an electronic device according to an embodiment of the present disclosure.

In yet another embodiment of the present disclosure, referring to FIG. 11, FIG. 11 shows a schematic structural diagram of compositions of an electronic device 50 according to an embodiment of the present disclosure. As shown in FIG. 11, the electronic device 50 includes at least the aforementioned memory 10 and the aforementioned control apparatus 30.

Since the memory 10 may output the first read clock signal with a plurality of pulses or the second read clock signal with a single level change edge, in a case of the duty cycle distortion of the internal clock signal in the memory 10, the second read clock signal with the single level change edge may be selected as the target read clock signal, and the control apparatus 30 performs data latching using the level change edge in the second read clock signal to avoid obtaining wrong data.

In some embodiments, "module", "unit" and the like may be implemented one or more hardware circuits/sub-circuits and/or one or more processors. In some examples, a module may include one or more circuits with or without stored codes or instructions. The module may include one or more components that are directly or indirectly connected. These components may or may not be physically attached to, or located adjacent to, one another.

The above are only the preferred embodiments of the present disclosure, and are not intended to limit the scope of protection of the present disclosure. It is to be noted that in this disclosure, the terms "including", "containing" or any other variation thereof are intended to cover non-exclusive inclusion, so that a process, method, article or device including a series of elements includes not only those elements, but also other elements not explicitly listed, or elements inherent to the process, method, article or device. Without more restrictions, an element defined by the sentence "including a . . . " does not exclude the existence of other identical elements in the process, method, article, or device including the element. The sequence numbers of the embodiments of the present disclosure are only for description, and do not represent the advantages or disadvantages of the embodiments. The methods disclosed in the several method embodiments provided in the present disclosure may be combined arbitrarily without conflict to obtain new method embodiments. The features disclosed in the several product embodiments provided in the present disclosure may be combined arbitrarily without conflict to obtain new product embodiment. The features disclosed in several method or device embodiments provided in the present disclosure may be combined arbitrarily without conflict to obtain new method embodiments or new device embodiments. The above are only the specific implementations of the present disclosure and not intended to limit the scope of protection of the present disclosure. Any variations or replacements apparent to those skilled in the art within the technical scope disclosed by the disclosure shall fall within the scope of protection of the present disclosure. Therefore, the scope of protection of the present disclosure shall be subject to the scope of protection of the claims.

The invention claimed is:

1. A memory, comprising a clock processing circuit, the clock processing circuit comprising:
    a duty cycle circuit, configured to receive a data clock signal externally generated, and adjust a duty cycle of the data clock signal to output an internal clock signal;
    a first clock generation circuit, configured to receive the internal clock signal, and output a first read clock signal based on the internal clock signal; wherein the first read clock signal is a pulse signal;
    a second clock generation circuit, configured to generate and output a second read clock signal during existence of the first read clock signal; wherein the second read clock signal has only one level state change edge; and
    a selector, configured to receive the first read clock signal and the second read clock signal, and output one of the first read clock signal and the second read clock signal as a target read clock signal.

2. The memory of claim 1, wherein the clock processing circuit further comprises a detection circuit and a mode register; wherein,
    the detection circuit is configured to receive the internal clock signal, and detect a duty cycle of the internal clock signal to output a duty cycle parameter; and
    the mode register is configured to receive and store the duty cycle parameter.

3. The memory of claim 2, wherein,
    the selector is configured to receive a selection indication signal, and output the first read clock signal as the target read clock signal in response to the selection indication signal being in a first state; or, output the second read clock signal as the target read clock signal in response to the selection indication signal being in a second state.

4. The memory of claim 3, wherein,
    the memory is configured to receive a data read instruction; and output a read data signal based on the data read instruction, and output the target read clock signal through the clock processing circuit;
    wherein the target read clock signal is used for latching the read data signal, and the level state change edge of the second read clock signal indicates an end time of valid data in the read data signal.

5. The memory of claim 4, wherein,
the memory is further configured to set the selection indication signal to be in the first state in response to the data read instruction being a first read instruction; or, set the selection indication signal to be in the second state in response to the data read instruction being a second read instruction;
wherein the second read instruction instructs to obtain the duty cycle parameter in the mode register in the clock processing circuit, and the first read instruction is a data read instruction other than the second read instruction.

6. The memory of claim 5, wherein,
the memory is further configured to set the selection indication signal to be in the first state in response to the data read instruction being the first read instruction; or,
set the selection indication signal to be in the first state in response to the data read instruction being the second read instruction and the duty cycle of the internal clock signal being within a preset range; or,
set the selection indication signal to be in the second state in response to the data read instruction being the second read instruction and the duty cycle of the internal clock signal being not within a preset range.

7. The memory of claim 1, wherein the first read clock signal comprises 8 clock cycles, and the level state change edge of the second read clock signal is aligned with a rising edge of a fifth clock cycle in the first read clock signal;
wherein the level state change edge of the second read clock signal is a change of the second read clock signal from a low level state to a high level state.

8. The memory of claim 7, wherein the duty cycle circuit comprises:
a receiver, configured to externally receive and output the data clock signal; and
an adjustment circuit, configured to adjust the duty cycle of the data clock signal to output the internal clock signal.

9. The memory of claim 8, wherein the data clock signal is a write clock signal.

10. A control apparatus, the control apparatus being a Central Processing unit (CPU) and being connected to a memory; wherein,
the control apparatus is configured to send a data read instruction to the memory; and receive a read data signal and a target read clock signal that are returned by the memory, and perform latch processing on the read data signal using the target read clock signal;
wherein the target read clock signal is a first read clock signal or a second read clock signal, the first read clock signal is a pulse signal, and the second read clock signal has only one level state change edge.

11. The control apparatus of claim 10, wherein,
the control apparatus is configured to receive the first read clock signal returned by the memory in response to the data read instruction being a first read instruction, and perform latch processing on the read data signal using the first read clock signal; or,
receive the second read clock signal returned by the memory in response to the data read instruction being a second read instruction, and perform latch processing on the read data signal using the level state change edge of the second read clock signal;
wherein the memory comprises a clock processing circuit, the second read instruction instructs to obtain a duty cycle parameter in a mode register in the clock processing circuit, and the first read instruction is a data read instruction other than the second read instruction.

12. The control apparatus of claim 10, wherein,
the control apparatus is further configured to receive the first read clock signal returned by the memory in response to the data read instruction being a second read instruction, and perform latch processing on the read data signal using level state change edges of the first read clock signal.

13. A clock processing method, applied to a memory, the method comprising:
receiving a data clock signal externally generated; and adjusting a duty cycle of the data clock signal to determine an internal clock signal;
determining a first read clock signal based on the internal clock signal; wherein the first read clock signal is a pulse signal;
generating a second read clock signal during existence of the first read clock signal; wherein the second read clock signal has only one level state change edge; and
outputting one of the first read clock signal and the second read clock signal as a target read clock signal.

14. The clock processing method of claim 13, wherein the memory comprises a mode register, and the method further comprises:
detecting a duty cycle of the internal clock signal to obtain a duty cycle parameter; and
storing the duty cycle parameter into the mode register.

15. The clock processing method of claim 14, wherein the memory is connected to a control apparatus, and outputting one of the first read clock signal and the second read clock signal as the target read clock signal comprises:
in response to receiving a first read instruction sent by the control apparatus, determining a read data signal based on the first read instruction, and determining the first read clock signal as the target read clock signal; or,
in response to receiving a second read instruction sent by the control apparatus, determining a read data signal based on the second read instruction, and determining the second read clock signal as the target read clock signal;
wherein the target read clock signal is used for latching the read data signal, the second read instruction instructs to obtain the duty cycle parameter in the mode register, and the first read instruction is a data read instruction other than the second read instruction.

16. The clock processing method of claim 14, wherein the memory is connected to a control apparatus, and outputting one of the first read clock signal and the second read clock signal as the target read clock signal comprises:
in response to receiving a first read instruction sent by the control apparatus, determining a read data signal based on the first read instruction, and determining the first read clock signal as the target read clock signal; or,
in response to receiving a second read instruction sent by the control apparatus and the duty cycle parameter being within a preset range, determining a read data signal based on the second read instruction, and determining the first read clock signal as the target read clock signal; or,
in response to receiving a second read instruction sent by the control apparatus and the duty cycle parameter being not within a preset range, determining a read data signal based on the second read instruction, and determining the second read clock signal as the target read clock signal;
wherein the target read clock signal is used for latching the read data signal, the second read instruction instructs to obtain the duty cycle parameter in the mode register, and the first read instruction is a data read instruction other than the second read instruction.

17. An electronic device, comprising the memory of claim 1, and a control apparatus being a Central Processing unit (CPU) and being connected to the memory; wherein, the control apparatus is configured to send a data read instruction to the memory; and receive a read data signal and the target read clock signal that are returned by the memory, and perform latch processing on the read data signal using the target read clock signal.

* * * * *